United States Patent
Kudoh

(10) Patent No.: US 12,370,729 B2
(45) Date of Patent: Jul. 29, 2025

(54) HEAT CONDUCTIVE SHEET AND METHOD FOR PRODUCING SAME

(71) Applicant: SEKISUI POLYMATECH CO., LTD., Saitama (JP)

(72) Inventor: Hiroki Kudoh, Kawaguchi (JP)

(73) Assignee: SEKISUI POLYMATECH CO., LTD., Saitama (JP)

(*) Notice: Subject to any disclaimer, the term of this patent is extended or adjusted under 35 U.S.C. 154(b) by 0 days.

(21) Appl. No.: 17/781,208

(22) PCT Filed: Dec. 2, 2020

(86) PCT No.: PCT/JP2020/044930
§ 371 (c)(1),
(2) Date: May 31, 2022

(87) PCT Pub. No.: WO2021/166370
PCT Pub. Date: Aug. 26, 2021

(65) Prior Publication Data
US 2022/0410448 A1    Dec. 29, 2022

(30) Foreign Application Priority Data
Feb. 21, 2020  (JP) .................. 2020-027848

(51) Int. Cl.
*F28F 13/00*  (2006.01)
*B29C 35/02*  (2006.01)
(Continued)

(52) U.S. Cl.
CPC .......... *B29C 45/0001* (2013.01); *B29C 35/02* (2013.01); *B29C 45/0013* (2013.01);
(Continued)

(58) Field of Classification Search
CPC .......... F28F 2013/005; F28F 2013/006; F28D 2021/0029; H01L 23/467; H01L 23/40; H01L 2023/4037; H01L 2023/4068
See application file for complete search history.

(56) References Cited

U.S. PATENT DOCUMENTS

| 5,221,575 A | * | 6/1993 | Nakano ................. H01L 23/373 |
| | | | 428/323 |
| 10,591,229 B2 | | 3/2020 | Watanabe |
| (Continued) | | | |

FOREIGN PATENT DOCUMENTS

| CN | 103975429 | 8/2014 |
| CN | 108384248 | 8/2018 |
| (Continued) | | |

OTHER PUBLICATIONS

International Search Report (ISR) issued Feb. 2, 2021 in International (PCT) Application No. PCT/JP2020/044930.

*Primary Examiner* — Frantz F Jules
*Assistant Examiner* — Jason N Thompson
(74) *Attorney, Agent, or Firm* — Wenderoth, Lind & Ponack, L.L.P.

(57) ABSTRACT

An object is to provide a heat conductive sheet having good handleability when mounting between the heating element and the heat dissipator, and softness that enables the distortion of the heating element, the heat dissipator, and the like to be suppressed in use. The heat conductive sheet contains: a matrix comprising a cured product of organopolysiloxane; and heat conductive fillers comprising anisotropic fillers with their major axes oriented in the thickness direction, and has a load property P represented b formula (1) below of 0.1 to 0.7:

Load property $P=(F_{30}-F_{20})/F_{10}$    (1)

(Continued)

wherein $F_{10}$ is a load of the heat conductive sheet at 10% compression, $F_{20}$ is a load of the heat conductive sheet at 20% compression, and $F_{30}$ is a load of the heat conductive sheet at 30% compression.

16 Claims, 1 Drawing Sheet

(51) Int. Cl.
| | |
|---|---|
| B29C 45/00 | (2006.01) |
| C08G 77/12 | (2006.01) |
| C08G 77/20 | (2006.01) |
| C08J 5/18 | (2006.01) |
| C08K 3/08 | (2006.01) |
| C08K 3/22 | (2006.01) |
| F28F 21/02 | (2006.01) |
| H01L 23/40 | (2006.01) |
| H01L 23/467 | (2006.01) |
| B29K 83/00 | (2006.01) |
| B29K 305/02 | (2006.01) |
| B29L 7/00 | (2006.01) |

(52) U.S. Cl.
CPC ......... *B29C 45/0055* (2013.01); *C08G 77/12* (2013.01); *C08G 77/20* (2013.01); *C08J 5/18* (2013.01); *C08K 3/08* (2013.01); *C08K 3/22* (2013.01); *F28F 21/02* (2013.01); *B29C 2045/0075* (2013.01); *B29C 2793/009* (2013.01); *B29K 2083/00* (2013.01); *B29K 2305/02* (2013.01); *B29K 2995/0013* (2013.01); *B29L 2007/002* (2013.01); *C08J 2383/07* (2013.01); *C08J 2483/05* (2013.01); *C08K 2003/0812* (2013.01); *C08K 2003/2227* (2013.01); *C08K 2201/001* (2013.01); *F28F 2013/006* (2013.01)

(56) References Cited

U.S. PATENT DOCUMENTS

| | | | |
|---|---|---|---|
| 10,689,556 B2 | 6/2020 | Watanabe et al. | |
| 11,008,462 B2 | 5/2021 | Kudoh | |
| 11,084,965 B2 | 8/2021 | Kudoh et al. | |
| 2004/0241410 A1* | 12/2004 | Fischer | C09J 7/35 |
| | | | 428/292.1 |
| 2004/0241417 A1* | 12/2004 | Fischer | C09J 11/04 |
| | | | 428/317.9 |
| 2005/0264998 A1* | 12/2005 | McCutcheon | H01L 23/4006 |
| | | | 257/E23.084 |
| 2008/0019097 A1* | 1/2008 | Zhang | F28F 13/00 |
| | | | 361/704 |
| 2013/0136895 A1* | 5/2013 | Usui | B29C 48/91 |
| | | | 428/141 |
| 2014/0346710 A1 | 11/2014 | Usui et al. | |
| 2014/0349067 A1 | 11/2014 | Usui et al. | |
| 2015/0054020 A1* | 2/2015 | Paolella | H01L 23/3736 |
| | | | 257/713 |
| 2018/0163112 A1* | 6/2018 | Watanabe | B32B 27/281 |
| 2018/0292148 A1 | 10/2018 | Watanabe | |
| 2019/0035712 A1 | 1/2019 | Kanaya et al. | |
| 2019/0092995 A1 | 3/2019 | Kudoh et al. | |
| 2020/0251402 A1 | 8/2020 | Kanaya et al. | |
| 2020/0385577 A1 | 12/2020 | Kudoh | |
| 2021/0269695 A1 | 9/2021 | Kudoh et al. | |

FOREIGN PATENT DOCUMENTS

| | | | |
|---|---|---|---|
| JP | 2007-326976 | 12/2007 | |
| JP | 2012-23335 | 2/2012 | |
| JP | 2013-127035 | 6/2013 | |
| JP | 2016-506 | 1/2016 | |
| JP | 2016-11322 | 1/2016 | |
| JP | 2020-7569 | 1/2020 | |
| KR | 10-2018-0086432 | 7/2018 | |
| WO | 2016/190258 | 12/2016 | |
| WO | 2016/208458 | 12/2016 | |
| WO | 2017/187940 | 11/2017 | |
| WO | 2019/004150 | 1/2019 | |
| WO | WO-2019004150 A1 * | 1/2019 | ............... C08J 5/18 |

\* cited by examiner

HEAT CONDUCTIVE SHEET AND METHOD FOR PRODUCING SAME

TECHNICAL FIELD

The present invention relates to a heat conductive sheet and a method for producing the same.

BACKGROUND ART

In electronic devices such as computers, automobile parts, and mobile phones, a heat dissipator such as a heat sink is generally used for dissipating heat generated from a heating element such as a semiconductor device and a mechanical part. It is known that a heat conductive sheet is disposed between the heating element and the heat dissipator for the purpose of enhancing the heat transfer efficiency to the heat dissipator.

The heat conductive sheet is generally used by being compressed when it is disposed inside the electronic device, and high softness is required. Accordingly, it is constituted by mixing fillers having heat conductivity into a matrix composed of a highly soft resin such as rubber and gel.

Further, various attempts have been made to enhance the heat dissipation in the heat conductive sheet. For example, a method of increasing the filling amount of the heat conductive fillers, and a method of orienting fillers having anisotropy such as carbon fibers in the thickness direction are widely known (for example, PTLs 1 and 2).

CITATION LIST

Patent Literature

PTL 1: JP 2016-000506 A
PTL 2: International Publication No. WO 2016/208458

SUMMARY OF INVENTION

Technical Problem

As described above, the heat conductive sheet has enhanced heat dissipation by orienting anisotropic fillers in the thickness direction. However, it is desired to be excellent in various physical properties other than heat dissipation since the heat conductive sheet is used by being compressed between the heating element and the heat dissipator. The heat conductive sheet is disposed between the heating element and the heat dissipator and is used by being compressed (highly compressed) at a comparatively high compression ratio. Therefore, if it is hard (low softness) at high compression, the load applied to the heating element and the heat dissipator, or the housing or the substrate to which they are attached increases, which may cause distortion in each member inside the electronic device. Accordingly, it is necessary to have high softness at high compression.

On the other hand, if the heat conductive sheet is too soft, it easily deforms, which makes it difficult to mount the heat conductive sheet between the heating element and the heat dissipator, resulting in deterioration in handleability. When the heat conductive sheet is mounted, it is compressed from the uncompressed state and thus is required to have a low softness at low compression to some extent. That is, excessively high softness deteriorates the handleability, whereas low softness causes distortion in the heating element, the heat dissipator, and the like during use. Therefore, there is a trade-off relationship between handleability and softness, and it is recognized as being difficult to achieve both. Accordingly, there is a demand for a technology that achieves both softness at high compression and handleability.

From the above, it is an object of the present invention to provide a heat conductive sheet comprising anisotropic fillers oriented in the thickness direction, the heat conductive sheet having good handleability when being mounted between the heating element and the heat dissipator, and softness that enables the distortion of the heating element, the heat dissipator, and the like to be suppressed when used at high compression.

Solution to Problem

As a result of diligent studies in order to solve the above problems, the inventor has found that the aforementioned problems can be solved by a heat conductive sheet: comprising a matrix comprising a cured product of organopolysiloxane; and heat conductive fillers comprising anisotropic fillers with their major axes oriented in the thickness direction, the heat conductive sheet having a certain load property, thereby accomplishing the present invention.

The present invention provides [1] to [11] below.

[1] A heat conductive sheet comprising: a matrix comprising a cured product of organopolysiloxane; and heat conductive fillers comprising anisotropic fillers with their major axes oriented in the thickness direction, the heat conductive sheet having a load property P represented by formula (1) below of 0.1 to 0.7:

$$\text{Load property } P = (F_{30} - F_{20})/F_{30} \qquad (1)$$

wherein $F_{10}$ is a load of the heat conductive sheet at 10% compression, $F_{20}$ is a load of the heat conductive sheet at 20% compression, and $F_{30}$ is a load of the heat conductive sheet at 30% compression.

[2] The heat conductive sheet according to [1] above, wherein the content of aluminum oxide is 10 vol % or less.

[3] The heat conductive sheet according to [1] or [2] above, wherein the heat conductive fillers comprise specific heat conductive fillers consisting of at least any of aluminum and aluminum hydroxide.

[4] The heat conductive sheet according to [3] above, wherein the volume filling rate of the specific heat conductive fillers consisting of at least any of aluminum and aluminum hydroxide is larger than the volume filling rate of heat conductive fillers other than the specific heat conductive fillers.

[5] The heat conductive sheet according to any of [1] to [4] above, wherein the load $F_{30}$ at 30% compression is 5 to 18 N/□12 mm.

[6] The heat conductive sheet according to any of [1] to [5] above, wherein the load $F_{10}$ at 10% compression is 3.5 to 10 N/□12 mm.

[7] The heat conductive sheet according to any of [1] to [6] above, being formed from a heat conductive composition comprising a silicone compound comprising organopolysiloxane; heat conductive fillers comprising anisotropic, fillers; and a volatile compound,

[8] The heat conductive sheet according to [7] above, wherein the volatile compound is a volatile silane compound.

[9] The heat conductive sheet according to [8] above, wherein the volume of the volatile silane compound with respect to the total volume of the silicone compound and the volatile silane compound in the heat conductive composition is 15 to 50 vol %.

[10] A method for producing the heat conductive sheet according to any of [1] to [9] above, the method comprising: preparation step 1 of preparing a heat conductive composition comprising a silicone compound comprising organopolysiloxane, heat conductive fillers comprising anisotropic fillers, and a volatile compound; curing step 2 of heating the heat conductive composition to cure the organopolysiloxane, thereby forming a primary cured product retaining the volatile compound: sheet-forming step 3 of slicing the primary cured product to obtain a sheet having a surface with the heat conductive fillers exposed, and volatilization step 4 of volatilizing the volatile compound contained in the sheet obtained by the sheet-forming step 3.

[11] The method for producing the heat conductive sheet according to [10] above, wherein the volatile compound is a volatile silane compound, and when the temperature at 90% weight loss when heated at 2° C./minute in the thermogravimetric analysis of the volatile silane compound is referred to as T1, the heating temperature in the curing step 2 is T1–50 (° C.) or lower.

Advantageous Effects of Invention

The present invention can provide a heat conductive sheet achieving both softness at high compression and handleability.

DESCRIPTION OF EMBODIMENTS

[Heat Conductive Sheet]

Figure 1:
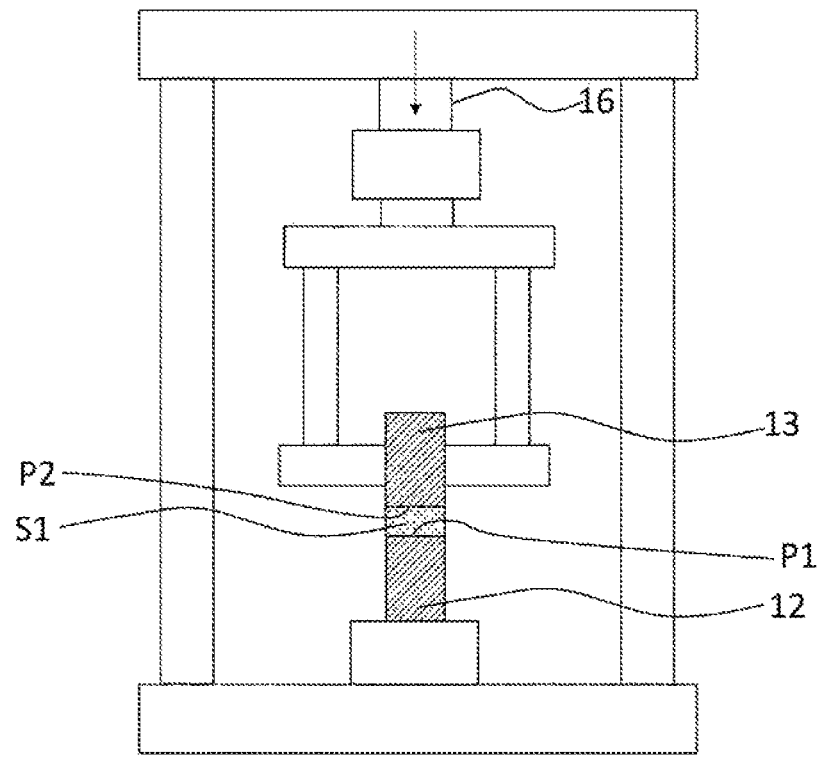
FIG. 1 is a diagram illustrating a measuring instrument to measure the load of a heat conductive sheet under compression.

The present invention is a heat conductive sheet comprising: a matrix comprising a cured product of organopolysiloxane; and heat conductive fillers comprising anisotropic fillers with their major axes oriented in the thickness direction, the heat conductive sheet, having a load property P represented by formula (1) below of 0.1 to 0.7;

$$\text{Load property } P=(F_{30}-F_{20})/F_{30} \quad (1)$$

wherein $F_{10}$ represents a load of the heat conductive sheet at 10% compression, $F_{20}$ is a load of the heat conductive sheet at 20% compression, and $F_{30}$ is a load of the heat conductive sheet at 30% compression.

In this description, X % compression in the load of the heat conductive sheet at each compression ratio means to compress the heat conductive sheet by X % of the thickness when the thickness of the heat conductive sheet is taken as 100%.

<Load Property P>

The heat conductive sheet of the present invention has a load property P represented by formula (1) of 0.1 to 0.7:

$$\text{Load property } P=(F_{30}-F_{20})/F_{30} \quad (1)$$

wherein $F_{10}$ is a load of the heat conductive sheet at 10% compression, $F_{20}$ is a load of the heat conductive sheet at 20% compression, and $F_{30}$ is a load of the heat conductive sheet at 30% compression.

The load property P deviating from the aforementioned range makes it difficult to achieve both handleability and softness of the heat conductive sheet. For further improving the balance of handleability and softness of the heat conductive sheet, the load property P is preferably 0.1 to 0.35.

The reason why the load property P falling within a specific range enables both handleability and softness of the heat conductive sheet to be achieved is presumed, as follows.

The denominator ($F_{10}$) in formula (1) has the same meaning as $F_{10}-F_0$ since $F_0$ (the load in the uncompressed state) is 0. Therefore, the denominator $F_{10}$ means the increment in load at 10% compression from the uncompressed (that is, $F_0$) state of the heat conductive sheet. Further, the numerator ($F_{30}-F_{20}$) in formula (1) means the increment in load at 30% compression from the state at 20% compression.

That is, the load property P of 0.1 to 0.7 means that the increment in load at high compression (20 to 30% compression) is lower than the increment in load at low compression (0 to 10% compression). In other words, it means that the inclination at high compression (20 to 30% compression) is lower than the inclination at low compression (0 to 10% compression) in a graph showing the relationship between the compression ratio and the load of the heat conductive sheet. It is considered that the inclination at low compression relates to the handleability when mounting the heat conductive sheet between the heating element and the heat dissipator, and the handleability is improved by relatively increasing the inclination at low compression. Meanwhile, it is considered that the inclination at high compression relates to the softness when using the heat conductive sheet compressed between the heating element and the heat dissipator, and the softness in use is enhanced by relatively reducing the inclination at high compression, so that distortion of the heating element, the heat dissipator, and the like can be prevented. That is, it is considered that a heat conductive sheet that is excellent in handleability and softness is obtained by relatively increasing the denominator in formula (1) and relatively reducing the numerator, so that the load property P falls within the aforementioned range.

The method for adjusting the load property P to such a range is not specifically limited, but examples thereof include a method of forming a heat conductive sheet with anisotropic fillers oriented in the thickness direction, using a heat conductive composition comprising a volatile compound, as described below.

For improving the handleability of the heat conductive sheet, $F_{10}$ is preferably 3.5 to 10 N/□12 mm, more preferably 6 to 9.5 N/□12 mm.

For improving the softness of the heat conductive sheet and suppressing the distortion of the heating element, the heat dissipator, and the like, $F_{30}$ is preferably 5 to 18 N/□12 mm, more preferably 6 to 12 N/□12 mm. The above □12 mm means the area of a square having a side length of 12 mm, and thus □12 mm has the same meaning as 144 mm$^2$.

$F_{10}$, $F_{20}$, and $F_{30}$ are measured by the method described in Examples.

<Weight Increase when Immersed in Isopropyl Alcohol>

The heat conductive sheet of the present invention preferably has a weight increase rate when immersed in isopropyl alcohol of 0.1 to 1.0 mass %. When the weight increase rate is the lower limit or more, the softness of the heat conductive sheet increases, whereas when the weight increase rate is the upper limit or less, the handleability is enhanced. From such points of view, the weight increase rate of the heat conductive sheet when immersed in isopropyl alcohol is more preferably 0.05 to 1 mass %, further preferably 0.1 to 0.5 mass %, further preferably 0.3 to 0.5 mass %.

The weight increase of the heat conductive sheet when immersed in isopropyl alcohol means that there is a certain volume of a site into which isopropyl alcohol can penetrate, such as voids, in the heat conductive sheet before immersion, which is considered to improve the handleability and the softness of the heat conductive sheet.

The weight increase rate of the heat conductive sheet when immersed in isopropyl alcohol is determined by immersing a sample (heat conductive sheet) in isopropyl alcohol at 25° C. for 3 minutes, then taking out the sample to wipe off the solvent on the surface, and taking the weight of the sample in a dry state as the weight of the sample after immersion using the following formula.

Weight increase rate (%)=[(weight of sample after immersion−weight of sample before immersion)/weight of sample before immersion]×100

<Matrix>

The heat conductive sheet of the present invention comprises a matrix comprising a cured product of organopolysiloxane. The matrix holds the heat conductive fillers and maintains the heat conductive sheet in a predetermined shape. The matrix is formed by curing organopolysiloxane that is a precursor of the matrix. The organopolysiloxane has a reactive group f or curing and is generally in liquid form. In this description, the liquid form refers to a liquid at 23° C. and a pressure of 1 atm.

Examples of the organopolysiloxane include condensed organopolysiloxane and addition-reaction type organopolysiloxane. The organopolysiloxane preferably includes addition-reaction type organopolysiloxane, since high filling with the heat conductive fillers is easy, and the curing temperature can be easily adjusted with a catalyst or the like. The addition-reaction type organopolysiloxane preferably includes alkenyl group-containing organopolysiloxane and hydrogen organopolysiloxane, for ease of high filling with the heat conductive fillers.

The amount of the cured product of the organopolysilosane with respect to the total amount of the heat conductive sheet is preferably 5 to 50 vol %, more preferably 10 to 40 vol %, further preferably 15 to 30 vol %.

Further, the matrix may contain oils, for improving the softness of the heat conductive sheet. Examples of the oils include hydrocarbon oils such as paraffin oil, poly α olefin and process oil, acrylic oils, silicone oils, and alkoxysiloxanes. Among them, silicone oils or alkoxysiloxanes are preferred, and dimethyl silicone oil is more preferred.

The amount of the oils with respect to the total amount of the heat conductive sheet is preferably 1 to 50 vol %, more preferably 3 to 30 vol %, further preferably 5 to 20 vol %.

Further, the content of the oils with respect to the total volume of the cured product of organopolysiloxane and oils is preferably 5 to 60 vol %, more preferably 10 to 50 vol %, further preferably 20 to 40 vol %.

The matrix may contain various additives without inhibiting the effects of the present invention other than the aforementioned components. Examples of the additives include dispersants, coupling agents, pressure-sensitive adhesives, flame retardants, antioxidants, colorants, precipitation inhibitors, crosslinking accelerators, curing accelerators.

<Heat Conductive Fillers>

The heat conductive sheet of the present invention comprises heat conductive fillers. The heat conductive fillers are dispersed in the matrix, thereby enhancing the heat dissipation in the heat conductive sheet. The heat conductive fillers comprise the anisotropic fillers described below.

(Anisotropic Fillers)

The heat conductive sheet of the present invention comprises heat conductive fillers comprising anisotropic fillers. The major axes of the anisotropic fillers are oriented in the thickness direction of the heat conductive sheet. This increases the heat dissipation in the heat conductive sheet. Further, since the major axes of anisotropic fillers are oriented in the thickness direction of the heat conductive sheet, the load property P is easily adjusted to the aforementioned desired range, and the handleability and the softness of the heat conductive sheet can be enhanced.

The anisotropic fillers are oriented in the thickness direction, as described above, but the major axis directions do not have to be strictly parallel to the thickness direction, and the major axis directions are regarded as being oriented in the thickness direction even if they are inclined to the thickness direction to some extent. Specifically, the anisotropic fillers with their major axis directions inclined at about less than 20° are regarded as being oriented in the thickness direction, and if such anisotropic fillers occupy the majority of the heat conductive sheet (for example, over 60%, preferably over 80% of the total number of anisotropic fillers), they are regarded as being oriented in the thickness direction.

The orientation directions (angles) of the anisotropic fillers and the ratio of the oriented anisotropic fillers can be estimated by observing any cross section perpendicular to the surface of the heat conductive sheet with an electron microscope or an optical microscope to measure the orientation angles of any 100 anisotropic fillers.

The anisotropic fillers are heat conductive fillers that can be oriented. The anisotropic fillers are those each having a high aspect ratio, such as fiber materials or flat materials, specifically, an aspect ratio of over 2, preferably an aspect ratio of 5 or more. The aspect ratio of over 2 facilitates orienting the anisotropic fillers in the thickness direction and enhancing the heat conductivity of the heat conductive sheet. Further, the upper limit of the aspect ratio is not specifically limited but is practically 100.

The aspect ratio means the ratio of fiber length/fiber diameter in the case where the anisotropic fillers are fiber materials and means the ratio of major axis length/minor axis length in the case where the anisotropic fillers are flat materials.

The content of the anisotropic fillers in the heat conductive sheet in terms of volume-based filling rate (volume filling rate) is preferably 2 to 40 vol %, more preferably 5 to 35 vol %, further preferably 8 to 30 vol %, with respect to the total amount of the heat conductive sheet.

The content of the anisotropic fillers of 2 vol % or more facilitates enhancing the heat conductivity, and the content of 40 vol % or less easily imparts a suitable viscosity to the heat conductive composition, which will be described below, resulting in good orientation of the anisotropic fillers.

When the anisotropic fillers are fiber materials (which may be referred to also as fibrous fillers), the average fiber length is preferably 5 to 600 μm, more preferably 10 to 400 μm, further preferably 70 to 300 μm. When the average fiber length is 5 μm or more, the anisotropic fillers come into appropriate contact with each other in the heat conductive sheet, to ensure a heat transfer path. Meanwhile, when the average fiber length is 600 μm or less, the bulk of the anisotropic fillers is reduced, so that high filling in the matrix is enabled.

Further, when the anisotropic fillers are flat materials (which may be referred to also as flat tillers), the average major axis length is preferably 5 to 300 μm, more preferably 10 to 200 μm, further preferably 40 to 135 μm.

When the average major axis length is 5 μm or more, the anisotropic fillers come into appropriate contact with each other inside the heat conductive sheet, to ensure a heat transfer path. Meanwhile, when the average major axis length is 300 μm or less, the bulk of the anisotropic fillers is reduced, so that high filling in the matrix is enabled.

The average fiber length, the fiber diameter, the average major axis length, and the average minor axis length can be calculated by observing the anisotropic fillers with a microscope. More specifically, the fiber lengths of any 100 anisotropic fillers are measured, for example, using an electron microscope or an optical microscope, and the average (arithmetic mean) thereof can be taken as the average fiber length. Further, the fiber diameter, the average major axis length, and the average minor axis length also can be determined in the same manner.

As the method for orienting the anisotropic fillers in the thickness direction of the heat conductive sheet, known methods such as a magnetic field orientation manufacturing process and a flow orientation manufacturing process, which will be described below, can be adopted.

Further, the anisotropic fillers are not specifically limited but generally have a heat conductivity along the major axis direction 60 W/m·K or more, preferably 400 W/m·K or more. The upper limit of the heat conductivity of the anisotropic fillers is not specifically limited but is, for example, 2,000 W/m·K or less. The method for measuring the heat conductivity is a laser flash method.

One type of anisotropic fillers may be used alone, or two or more types thereof may be used in combination. For example, anisotropic having at least two different average fiber lengths or average major axis lengths may be used as the anisotropic fillers. It is considered that use of anisotropic fillers with different sizes enables the matrix to be filled with the anisotropic fillers at a high density by small anisotropic fillers entering between relatively large anisotropic fillers to enhance the heat conduction efficiency.

Materials known to have heat conductivity may be used for the anisotropic fillers, the materials preferably have a diamagnetism so that the magnetic field can be oriented, as described below.

The anisotropic fillers may be any fillers satisfying the aforementioned aspect ratio but preferably contain at least one of fiber materials and flat materials.

Further, the anisotropic fillers may contain materials other than fiber materials and flat materials, but those consisting of either one of fiber materials and flat materials or those containing both fiber materials and flat materials are preferred, and those consisting of both fiber materials and flat materials are more preferred.

Specific examples of the anisotropic fillers include fiber materials such as metal fibers made of iron, copper, silver, aluminum, stainless steel, or the like, and carbon fibers, and flat materials such as flaky graphite and boron nitride. Among the fiber materials, carbon fibers having a small specific gravity and good dispersibility in the matrix are preferred. Among the carbon fibers, graphitized carbon fiber is preferred. Among the flat materials, flaky graphite is preferred.

Since graphitized carbon fibers and flaky graphite have a high heat conductivity, they have diamagnetism by their graphite surfaces aligned in a predetermined direction.

(Non-Anisotropic Fillers)

The heat conductive fillers contained in the heat conductive sheet of the present invention preferably contain non-anisotropic fillers other than the anisotropic fillers. The non-anisotropic fillers each have an aspect ratio of 2 or less, preferably 1.5 or less. Use of the non-anisotropic fillers suppresses an increase in viscosity of the heat conductive composition and enhances the dispersibility. For example, if the fiber length is increased, the contact area of the anisotropic fillers each other is difficult to be increased, but a heat transfer path can be formed by non-anisotropic fillers filling between the anisotropic fillers, so that a heat conductive sheet having high heat conductivity is obtained.

Specific examples of the non-anisotropic fillers include metals, metal oxides, metal nitrides, metal hydroxides, and carbon materials, and oxides, nitrides, and carbides other than metals. Further, examples of the shape of the non-anisotropic fillers include spherical powder and infinite form powder.

In the non-anisotropic fillers, examples of the metals can include aluminum, copper, and nickel, examples of the metal oxides can include aluminum oxide typified by alumina, magnesium oxide, and zinc oxide, and examples of the metal nitrides can include aluminum nitride. Examples of the metal hydroxides include aluminum hydroxide. Further, examples of the carbon materials include spherical graphite. Examples of the oxides, nitrides, and carbides other than metals include quartz, boron nitride, and silicon carbide.

The average particle size of the non-anisotropic fillers is preferably 0.1 to 70 μm, more preferably 0.5 to 20 μm, further preferably 1 to 15 μm. The average particle size of 70 μm or less makes problems such as disturbing the orientation of the anisotropic fillers less likely to occur, and the average particle size of 20 μm or less almost eliminates disturbing the orientation of the anisotropic fillers. Further, the average particle size of 0.1 μm or more prevents the specific surface area of the non-anisotropic fillers from increasing more than necessary and the viscosity of the heat conductive composition from increasing even when contained in a large amount, and facilitates high filling with the non-anisotropic fillers.

In the case where the non-anisotropic fillers having an average particle size of 20 μm to 70 μm are contained, the amount of the non-anisotropic fillers having an average particle size of 20 to 70 μm in the total non-anisotropic fillers is preferably 5 vol % or less.

The average particle size of the non-anisotropic fillers can be measured by observation with an electron microscope or the like. Specifically, the particle sizes of any 50 non-anisotropic fillers are measured using an electron microscope or an optical microscope, and the average (arithmetic mean) thereof can be taken as the average particle size.

The volume filling rate of the non-anisotropic fillers in the total amount of the heat conductive sheet is preferably 10 to 70 vol %, more preferably 30 to 60 vol %, further preferably 40 to 60 vol %.

Among them, the heat conductive fillers preferably comprise specific heat conductive fillers consisting of at least any of aluminum and aluminum hydroxide. The load property P is easily adjusted to the aforementioned range by containing the specific heat conductive fillers. It is more preferred that the specific heat conductive fillers consist of aluminum.

For adjusting the load property P to a desired value more easily, the volume filling rate of the specific heat conductive fillers in the total amount of the heat conductive sheet is preferably larger than the volume filling rate of the heat conductive fillers other than the specific heat conductive fillers. The volume filling rate of the specific heat conductive fillers is preferably 10 to 70 vol %, more preferably 30 to 60 vol %, further preferably 40 to 55 vol %.

In the case of using aluminum hydroxide as the heat conductive fillers, it is preferred to use small-particle size aluminum hydroxide having an average particle size of 0.1 μm or more and 5 μm or less and medium-particle size aluminum hydroxide having an average particle size of over 5 μm and 20 μm or less in combination. In this case, the volume ratio of the small-particle size aluminum hydroxide to the medium-particle size aluminum hydroxide (small-particle size aluminum hydroxide/medium-particle size aluminum hydroxide) is preferably 0.05 to 5, more preferably 0.1 to 1, further preferably 0.2 to 0.5.

Further, it is preferred to use large-particle size aluminum hydroxide having an average particle size of over 20 μm and 70 μm or less in combination. In this case, the amount of the large-particle size aluminum hydroxide in the total non-anisotropic fillers is preferably 5 vol % or less, so that the flame retardancy can be enhanced effectively without causing problems such as disturbing the orientation of the anisotropic fillers.

Further, for adjusting the load property P of the heat conductive sheet to the aforementioned desired value easily, the content of aluminum oxide is preferably less, specifically, the volume filling rate of aluminum oxide in the total amount of the heat conductive sheet is preferably 10 vol % or less, more preferably 5 vol % or less, further preferably 1 vol % or less.

Further, for enhancing the heat dissipation and the insulation of the heat conductive sheet, a certain amount or more of aluminum oxide is preferably contained, specifically, the volume filling rate of aluminum oxide in the total amount of the heat conductive sheet is preferably 0.1 vol % or more, more preferably 0.3 vol % or more.

(Volatile Compound)

The heat conductive sheet of the present invention is formed from a heat conductive composition. More specifically, the heat conductive sheet is preferably formed from a heat conductive composition comprising a silicone compound comprising organopolysiloxane; heat conductive fillers comprising anisotropic fillers; and a volatile compound. The silicone compound is a compound having a siloxane bond, and examples thereof include the aforementioned organopolysiloxane and silicone oils contained as required in the present invention. The heat conductive fillers are as described above, and include the anisotropic fillers, and further include non-anisotropic fillers, as required.

The heat conductive composition comprising a volatile compound makes it easy to obtain a heat conductive sheet having the load property P adjusted to the aforementioned desired range. For example, the load property P is easily adjusted to a certain range by obtaining a heat conductive sheet by applying the later-described method for fabricating a heat conductive composition comprising a volatile compound.

In the heat conductive composition, the volume of the volatile compound with respect to the total volume of the silicone compound and the volatile compound is preferably 10 to 50 vol %, more preferably 10 to 40 vol %, further preferably 10 to 34 vol %.

The term volatile in this description means to have at least any of properties of a temperature $T1$, at which the weight loss is 90% when heated at 2° C./minute in the thermogravimetric analysis, in the range of 70 to 300° C. and a boiling point (at a pressure of 1 atm) in the range of 60 to 200° C. Here, the temperature $T1$ at 90% weight loss means, when the weight of the sample before the thermogravimetric analysis is taken as 100%, a temperature at which 90% of the weight is reduced (that is, a temperature at which 10% of the weight before measurement remains).

Examples of the volatile compound include a volatile silane compound and a volatile solvent. Among them, a volatile silane compound is preferred.

Examples of the volatile silane compound include an alkoxysilane compound. The alkoxysilane compound is a compound having a structure in which 1 to 3 of the 4 bonds of a silicon atom (Si) bind to alkoxy groups, and the residual bonds bind to organic substituents. Examples of the alkoxy group of the alkoxysilane compound include a methoxy group, an ethoxy group, a protoxy group, a butoxy group, a pentoxy group, and a hexatoxy group. The alkoxysilane compound may be contained as a dimer.

Above all, an alkoxysilane compound having a methoxy group or an ethoxy group is preferred in view of ease of availability. The number of alkoxy groups of the alkoxysilane compound is preferably 3, for enhancing the affinity with the heat conductive fillers as inorganic substances. The alkoxysilane compound is more preferably at least one selected from a trimethoxysilane compound and a triethoxysilane compound.

Examples of functional groups contained in the organic substituents of the alkoxysilane compound include an acryloyl group, an alkyl group, a carboxyl group, a vinyl group, a methacryl group, an aromatic group, an amino group, an isocyanate group, an isocyanurate group, an epoxy group, a hydroxyl group, and a mercapto group. Here, in the case of using addition-reaction type organopolysiloxane containing a platinum catalyst as a precursor of the matrix, an alkoxysilane compound that less likely to affect the curing reaction of organopolysiloxane forming the matrix is preferably selected for use. Specifically, in the case of using addition-reaction type organopolysiloxane containing a platinum catalyst, the organic substituents of the alkoxysilane compound are preferably free from an amino group, an isocyanate group, an isocyanurate group, a hydroxyl group, or a mercapto group.

The alkoxysilane compound enhances the dispersibility of the heat conductive fillers, thereby making high filling with the heat conductive fillers easy. Therefore, an alkyl alkoxysilane compound having an alkyl group bound to a silicon atom, that is, an alkoxysilane compound having an alkyl group as an organic substituent is preferably contained. The alkyl group bound to a silicon atom preferably has 4 or more carbon atoms. Further, the alkyl group bound to a silicon atom preferably has 16 or less carbon atoms, for achieving comparatively low viscosity of the alkoxysilane compound itself to reduce the viscosity of the heat conductive composition.

One type or two or more types of alkoxysilane compounds can be used. Specific examples of the alkoxysilane compound include an alkyl group-containing alkoxysilane compound, a vinyl group-containing alkoxysilane compound, an acryloyl group-containing alkoxysilane compound, a methacryl group-containing alkoxysilane compound, an aromatic group-containing alkoxysilane compound, an amino group-containing alkoxysilane compound, an isocyanate group-containing alkoxysilane compound, an isocyanurate group-containing alkoxysilane compound, an epoxy group-containing alkoxysilane compound, and a mercapto group-containing alkoxysilane compound.

Examples of the alkyl group-containing alkoxysilane compound include methyltrimethoxysilane, dimethyldimethoxysilane, trimethylmethoxysilane, methyltriethoxysilane, dimethyldiethoxysilane, ethyltrimethoxysilane, n-propyltrimethoxysilane, n-propyltriethoxysilane, isobutyltrimethoxysilane, isobutyltriethoxysilane, n-hexyltrimethoxysilane, n-hexylinethoxysilane, cyclohexylmethyldimethoxysilane, n-octyltriethoxysilane, and n-decyltrimethoxysilane. Among the alkyl group-containing alkoxysilane compounds, at least one selected from isobutyltrimethoxysilane, isobutyltriethoxysilane, n-hexyltrimethoxysilane, n-hexyltriethoxysilane, cyclohexylmethyldimethoxysilane, n-octyltriethoxysilane, and n-decyltrimethoxysilane is preferred, and at least one selected from n-octyltriethoxysilane and n-decyltrimethoxysilane is more preferred.

Examples of the vinyl group-containing alkoxysilane compound include vinyltrimethosysilane and vinyltriethoxysilane. Examples of the acryloyl group-containing alkoxysilane compound include 3-acryloxypropyltrimethosysilane, Examples of the methacryl group-containing alkoxysilane compound include 3-methacryloxypropylmethyldimethoxysilane, 3-methacryloxypropyltrimethoxysilane, and 3-methacryloxypropyltriethoxysilane. Examples of the aromatic group-containing alkoxysilane compound include phenyltrimethoxysilane and phenyltriethoxysilane. Examples of the amino group-containing alkoxysilane compound include N-2-(aminoethyl)-3-aminopropylmethyldimethoxysilane, N-2-(aminoethyl)-3-aminopropyltrimethoxysilane, 3-amininopropyltrimethoxysilane, 3-aminopropyltriethoxysilane, and N-phenyl-3-aminopropyltrimethoxysilane. Examples of the isocyanate group-containing alkoxysilane compound include 3-isocyanate propyltriethoxysilane. Examples of the isocyanurate group-containing alkoxysilane compound include tris-(trimethoxysilylpropyl) isocyanurate. Examples of the epoxy group-containing alkoxysilane compound include 2-(3,4-epoxycyclohexyl) ethyltrimethoxysilane, 3-glycidoxypropylmethyldimethoxysilane, 3-glycidoxypropyltrimethoxysilane, and 3-glycidoxypropyltriethoxysilane. Examples of the mercapto group-containing alkoxysilane compound include 3-mercaptopropyltrimethoxysilane.

The aforementioned specific examples of the alkoxysilane compounds are examples, and there is no limitation to these.

As the volatile solvent, a solvent having a boiling point (at a pressure of 1 atm) of 60 to 200° C. can be used, and a solvent having a boiling point of 100 to 130° C. can be preferably used. Further, the volatile solvent preferably has a boiling point higher than the curing temperature of organopolysiloxane by 10° C. or higher, more preferably by 20° C. or higher.

As the type of volatile solvent, a solvent that satisfies the aforementioned requirements can be appropriately selected, for example, aromatic compounds such as toluene is preferably used.

(Applications of Heat Conductive Sheet)

The heat conductive sheet of the present invention is used by being disposed between the heating element and the heat dissipator. The thickness of the heat conductive sheet is, for example, in the range of 0.1 mm to 10 mm. The heat conductive sheet is preferably disposed between the heating element and the heat dissipator in the state of being compressed in the thickness direction. Examples of the heating element include semiconductor devices such as CPU and mechanical parts. Examples of the heat dissipator include heat sinks and housings.

The heat conductive sheet of the present invention has a load property P within a certain range, as described above, thereby enhancing the handleability when mounting between the heating element and the heat dissipator and enabling the distortion of the heating element, the heat dissipator, and the like to be suppressed when compressed for use.

The heat conductive sheet of the present invention contains anisotropic fillers with their major axes oriented in the thickness direction. Thereby, the heat conductive sheet can exert a high heat conductivity in the thickness direction, for example, of 15 W/m·K or more, preferably 20 W/m·K or more, more preferably 25 W/m·K or more. The heat conductivity of the heat conductive sheet is a value measured by the method described in Examples.

[Method for Producing Heat Conductive Sheet]

The method for producing the heat conductive sheet of the present invention is not specifically limited but is preferably a method for producing the heat conductive sheet, comprising steps 1 to 4 below:

preparation step 1 of preparing a heat conductive composition comprising a silicone compound comprising organopolysiloxane, heat conductive fillers comprising anisotropic fillers, and a volatile compound;

curing step 2 of heating the heat conductive composition to cure the organopolysiloxane, thereby forming a primary cured product retaining the volatile compound;

sheet-forming step 3 of slicing the primary cured product to obtain a sheet having a surface with the heat conductive fillers exposed; and volatilization step 4 of volatilizing the volatile compound contained in the sheet obtained by the sheet-forming step 3.

<Preparation Step 1>

Preparation step 1 is a step of preparing a heat conductive composition comprising a silicone compound comprising organopolysiloxane, heat conductive fillers comprising anisotropic fillers, and a volatile compound.

The heat conductive composition is obtained by mixing the silicone compound comprising organopolysiloxane, the heat conductive fillers comprising anisotropic fillers, and the volatile compound in predetermined amounts. More specifically, the method for producing a heat conductive composition comprises a dispersion step of dispersing heat conductive fillers in a silicone compound, and compounding step of mixing a volatile compound. The compounding step of mixing the volatile compound may be performed at any timing of before the dispersion step, after the dispersion step, and simultaneously with the dispersion step. Further, the heat conductive composition may contain the aforementioned additives, as required. For the dispersion step and the compounding step, well-known stirrers and dispersers can be used.

The amount of each component to be mixed in the heat conductive composition may be appropriately adjusted so as to be the amount described above when the heat conductive sheet is formed.

Here, the volatile compound mixed in the heat conductive composition may form part of the surface-modified heat conductive fillers, for example, by bonding to the surface of the heat conductive fillers. Further, the volatile compound mixed in the heat conductive composition may volatilize when obtaining the heat conductive composition. Therefore, the content of the volatile compound in the heat conductive composition may be adjusted in consideration of the amount to be consumed by reaction between the volatile compound and another compound or the amount to be removed by volatilization in the production process.

<Curing Step 2>

Curing step 2 is a step of heating the heat conductive composition prepared in preparation step 1, to cure the organopolysiloxane, so as to form a primary cured product retaining the volatile compound.

The organopolysiloxane can be cured by heating the heat conductive composition, but heating conditions such as heating temperature need to be set so as not to volatilize the entire volatile compound at the heating, for allowing the primary cured product formed after heating to retain the volatile compound.

The heating temperature is preferably set according to the types of the volatile compound. In the case where the volatile compound is a volatile silane compound, when the temperature at 90% weight loss when heated at 2° C./minute in the thermogravimetric analysis is referred to as T1 (° C.), the heating temperature is preferably T1−50 (° C.) or lower, more preferably T1−100 (° C.) or lower. In the case where volatile compound is a volatile solvent, when the boiling point of the volatile solvent is referred to as T2 (° C.), the heating temperature is preferably T2−10 (° C.) or lower, more preferably T2−30 (° C.) or lower.

For suppressing the volatilization of the volatile compound, the heating temperature is preferably lower, and the lower limit is not limited. The condition can be appropriately selected in consideration of the curing time (heating time), and curing can be performed, for example, at room temperature.

The heating time is preferably 180 minutes or less, more preferably 120 minutes or less.

Appropriately selecting the heating conditions as above allows a primary cured product retaining the volatile compound to be obtained.

The primary cured product obtained in curing step 2 is a cured product in which the anisotropic fillers are oriented along one direction in the thickness direction of the heat conductive sheet. More specifically, such a primary cured product can be obtained by the magnetic field orientation manufacturing process, the flow orientation manufacturing process, or the like.

(Magnetic Field Orientation Manufacturing Process)

In the magnetic field orientation manufacturing process, the heat conductive composition injected in a mold or the like is placed in a magnetic field, so that the anisotropic fillers are oriented along the magnetic field, and then the organopolysiloxane contained in the heat conductive composition is cured, to obtain a primary cured product. The primary cured product is preferably in block form.

Further, a release film may be disposed in the portion in contact with the heat conductive composition inside the mold. A resin film with good releasability or a resin film with one side peeled with a remover or the like, for example, is used as the release film. Use of the release film facilitates releasing the primary cured product from the mold.

In the magnetic field orientation manufacturing process, examples of the source of the magnetic field line for applying the magnetic field line include superconducting magnets, permanent magnets, and electromagnets, and the superconducting magnets are preferred since they can generate a magnetic field with high magnetic flux density. The magnetic flux density of the magnetic field generated from these magnetic field line sources is preferably 1 to 30 tesla. The magnetic flux density of 1 tesla or more enables the anisotropic fillers such as carbon materials to be easily oriented. Further, the magnetic flux density of 30 tesla or less enables practical production.

The heat conductive composition is cured by heating, and the heating conditions are as described above.

(Flow Orientation Manufacturing Process)

In the flow orientation manufacturing process, a shear force is applied to the heat conductive composition, to produce a preliminarily sheet with the anisotropic fillers oriented in the plane direction, and a plurality of pieces of such preliminarily sheets are laminated and cured, to produce a laminated block, so that the laminated block may be used as the primary cured product.

Specifically, the heat conductive composition is stretched flat to form a sheet (preliminarily sheet) while applying a shear force. The anisotropic fillers can be oriented in the shearing direction by applying a shear force. As means for forming the sheet, the heat conductive composition may be applied onto a base film, for example, by using an applicator for coating such as a bar coater and a doctor blading, or extrusion molding, ejection from a nozzle, or the like, followed by volatile compound, drying of part of volatile components containing a low boiling point solvent other than the volatile compound or semi-curing of a mixed composition, as required.

The thickness of each preliminarily sheet is preferably about 50 to 250 μm. In the preliminarily sheet, the anisotropic fillers are oriented in one direction along the plane direction of the sheet. Specifically, the orientation is such that, when the anisotropic fillers are made of a fiber material, the axis direction of the fibers is oriented in the coating direction, whereas when the anisotropic fillers are made of a flat material, the major axis is oriented in the coating direction, and the minor axis is oriented in the normal direction of the sheet surface.

Then, a plurality of preliminarily sheets are laminated in layers so as to be oriented in the same direction, followed by heating and curing, to form a laminated block by bonding the preliminarily sheets to each other with a hot press or the like, so that the laminated block may serve as the primary cured product. The heating conditions are as described above, it is preferred that curing be performed in a low temperature range among the heating conditions, for suppressing the volatilization of the volatile compound since the preliminarily sheets are thin. Further, the curing time is preferably 120 minutes or less, further preferably 60 minutes or less, particularly preferably 30 minutes or less.

<Sheet-Forming Step 3>

Sheet-forming step 3 is a step of slicing the primary cured product to obtain a sheet having a surface with the heat conductive fillers exposed. The primary cured product is sliced in a direction perpendicular to the orientation direction of the anisotropic fillers. The slicing may be performed, for example, by a shear blade. In the primary cured product, the tips of the anisotropic fillers are exposed from the matrix on each surface which is the cut surface by slicing. Most of the exposed anisotropic materials are oriented in the thickness direction. The surface of the sheet obtained by slicing on which the heat conductive fillers are exposed may be polished.

<Volatilization Step 4>

Volatilization step 4 is a step of volatilizing the volatile compound contained in the sheet obtained by sheet-forming step 3 above. The volatile compound can be volatilized by heating the sheet to a temperature at which the volatile compound is volatilized or higher. Specifically, in the case where the volatile compound volatile is a volatile silane compound, when the temperature at 90% weight loss when heated at 2° C./minute in the thermogravimetric analysis is referred to as T1 (° C.), heating to a temperature of T1−50° C. or higher is preferred, and heating to a temperature of T1−50° C. or higher and T1+100° C. or lower is more preferred. Further, in the case where the volatile compound is a volatile solvent, when the boiling point of the volatile solvent is referred to as T2 (° C.), heating to a temperature of T2 or higher is preferred, and heating to a temperature of T2 or higher and T2+100° C. or lower is more preferred.

Further, the volatilization time is preferably 120 minutes or more, more preferably 300 minutes or more.

Appropriately selecting the volatilize conditions as described above allows a sheet with most of the volatile compound volatilized to be obtained.

Volatilization of the volatile compound contained in the sheet allows voids to be formed in the portion where the volatile compound has been present inside the sheet, so that a heat conductive sheet having voids is obtained. This facilitates adjusting the load property P to the desired range and obtaining a heat conductive sheet that is excellent in handleability and softness.

EXAMPLES

Hereinafter, the present invention will be described in more detail by way of examples, but the present invention is not limited by these example at all.

In the present examples, evaluation was made by the following methods.

[Load Property P]

The load $F_{10}$ at 10% compression, the load $F_{20}$ at 20% compression, and the load $F_{30}$ at 30% compression of the heat conductive sheet were measured using the measuring instrument shown in FIG. 1.

(Measuring Instrument)

As shown in FIG. 1, the measuring instrument to measure each load includes a first copper block 12 and a second copper block 13. The first copper block 12 is disposed in a lower part of the measuring instrument, and the second copper block 13 is disposed above the first copper block 12. The upper surface of the first copper block 12 is a mounting surface P1 on which a test specimen S1 of the heat conductive sheet is mounted, and the mounting surface P1 has dimensions of 12 mm×12 mm. The measuring instrument further includes a cylinder 16 connected to the second copper block 13. The second copper block 13 is configured to compress the test specimen S1 mounted on the mounting surface P1 of the first copper block 12 by an operation of pressing the cylinder 16. A pressing surface P2 of the second copper block 13 included in the cylinder 16 also has dimensions of 12 mm×12 mm.

(Measurement)

The test specimen S1 with a size of 12 mm×12 mm and a thickness of 2 mm for this test was produced from the heat conductive sheet obtained in each of Examples and Comparative Examples and attached to the mounting surface P1 on the upper surface of the first copper block 12. Thereafter, the cylinder 16 was pressed to compress the test specimen with the second copper block 13 at a predetermined compression ratio, and $F_{10}$, $F_{20}$, and $F_{30}$ were measured. The measurement was performed at 25° C. Based on the results obtained, the load property P was calculated by formula (1).

$$\text{Load property } P=(F_{30}-F_{20})/F_{30} \tag{1}$$

[Heat Conductivity]

The heat conductivity of the heat conductive sheet was measured using a heat resistance measuring instrument by a method according to ASTM D5470-06.

(Measuring Instrument)

Figure 2:
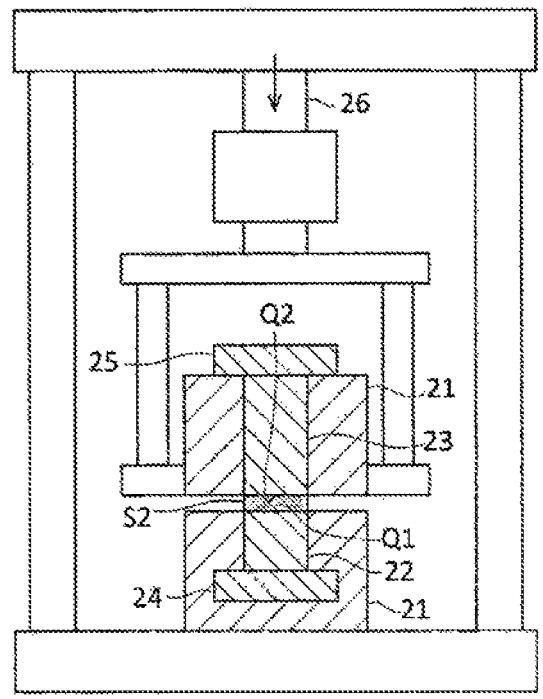
FIG. 2 is a diagram illustrating a measuring instrument to measure the heat conductivity of a heat conductive sheet.

As shown in FIG. 2, the heat resistance measuring instrument includes a first copper block 22 and a second copper block 23 with their lateral surfaces covered by a heat insulator 21. The first copper block 22 is disposed in a lower part of the heat resistance measuring instrument, and the second copper block 23 is disposed above the first copper block 22. The upper surface of the first copper block 22 is a mounting surface Q1 on which a test specimen S2 of the heat conductive sheet is mounted, and the mounting surface Q1 has dimensions of 25.4 mm×25.4 mm. The heat resistance measuring instrument further includes a heater 24 to heat the lower surface of the first copper block 22, and a heat sink 25 with fan to cool the upper surface of the second copper block 23. The heat resistance measuring instrument further includes a cylinder 26 connected to the second copper block 23. The second copper block 23 is configured to compress the test specimen S2 mounted on the mounting surface Q1 of the first copper block 22 by pressing the cylinder 26.

(Measurement)

For measuring the heat conductivity, the test specimen S2 (with a size of 25.4 mm×25.4 mm and a thickness of 2 mm) was first disposed between the first copper block 22 and the second copper block 23, and the test specimen S2 was compressed so that the compression ratio in the thickness direction was 20%. Then, the heater 24 was allowed to generate heat so that the temperature of the mounting surface Q1 of the first copper block 22 was 80° C. After being left standing for 15 minutes so that the temperature (temperature $\theta_{j1}$) of the mounting surface Q1 of the first copper block 22 was in a steady state of 80° C., the temperature (temperature $\theta_{j0}$) of a lower surface Q2 of the second copper block 23 (contact surface in contact with the test specimen S2) was measured. Further, the calorific value (the calorific value Q) of the heater 24 at that time and the thickness (thickness T) of the test specimen S2 were measured. The value of the heat resistance of the test specimen S2 calculated by formula (2) below was substituted into formula (3) below to determine the heat conductivity.

$$\text{Heat resistance}=(\theta_{j1}-\theta_{j0})/Q \tag{2}$$

$$\text{Heat conductivity}=T/\text{heat resistance} \tag{3}$$

[Weight Increase Rate when Immersed in Isopropyl Alcohol]

The heat conductive sheet (with a size of 20 mm×20 mm and a thickness of 2 mm) obtained in each of Examples and Comparative Examples was used as a sample. This sample was immersed in isopropyl alcohol at 25° C. for 3 minutes, then the sample was taken out, and the solvent on the surface was wiped off, to determine the weight increase rate by the following formula, with the weight of the sample in the dry state taken as a weight of the sample after immersion.

Weight increase rate (%)=[(weight of sample after immersion−weight of sample before immersion)/weight of sample before immersion]×100

[T1 of Volatile Silane Compound]

The temperature T1 at 90% weight loss of the alkoxysilane compound as the volatile silane compound was measured using a TG-DTA device (differential thermal/thermogravimetric simultaneous measurement device "DTG-60", available from SHIMADZU CORPORATION). Specifically, 20 mg of the alkoxysilane compound was weighed and heated to 25 to 300° C. at 2° C./minute under a nitrogen atmosphere, to measure the temperature T1 at 90% weight loss.

[Orientation Directions of Anisotropic Fillers]

In each table, the case where the major axes of the anisotropic fillers were oriented in the thickness direction of the heat conductive sheet was depicted as "thickness", and the case where they were oriented perpendicularly to the thickness direction was depicted as "horizontal".

[Distortion of Adherends]

Two stainless steel plates each having dimensions of 100 mm×100 mm and a thickness of 2 mm were prepared as a heating element (housing with heating element) and a heat dissipator. Subsequently, the heat conductive sheet having a thickness of 2 mm and a size of 12 mm×12 mm produced in each of Examples and Comparative Examples was compressed to a thickness of 1.4 mm and mounted between the two plates. At that time, the thickness was adjusted by screwing with spacers having a thickness of 1.4 mm interposed at the positions 5 mm from each side at the four corners of the stainless steel plates. Then, the state of the plate after being left for 10 minutes after mounting was visually observed to evaluate the distortion of the adherend. Example 1 with almost no distortion observed in the plates was evaluated as "B", those with distortion similar to that of Example 1 was evaluated as "B", those with less distortion than that of Example 1 was evaluated as "A", those with slightly more distortion than that of Example 1 was evaluated as "C", and those with more distortion than that of Example 1 and there was a practical problem was evaluated as "D".

[Handleability]

The workability when the heat conductive sheet formed on a release sheet was mounted between the two stainless steel plates having dimensions of 100 mm×100 mm and a thickness of 2 mm was evaluated. The workability was evaluated with reference to the time to mount the heat conductive sheet.

A . . . Extremely excellent workability
B . . . Excellent workability
C . . . Good workability, though it was inferior to that of B
D . . . Poor workability The components used in each of Examples and Comparative Examples were as follows.

(Organopolysiloxane)
Alkenyl group-containing organopolysiloxane as a base agent and addition-reaction type organopolysiloxane containing hydrogen organopolysiloxane as a curing agent (Silicone Oil)
Dimethyl silicone oil (Anisotropic Fillers)
Carbon fiber A having an average fiber length of 200 μm
Carbon fiber B having an average fiber length of 300 μm
Carbon fiber C having an average fiber length of 100 μm
Flaky graphite having an average major axis length 100 μm (Non-Anisotropic Fillers)
Aluminum having an average particle size of 3 μm, spherical
Aluminum hydroxide A having an average particle size of 1 μm, infinite form
Aluminum hydroxide B having an average particle size of 10 μm, infinite form
Aluminum oxide A having an average particle size of 1 μm, spherical
Aluminum oxide B having an average particle size of 5 μm, spherical
Aluminum oxide C having an average particle size of 10 μm, spherical
Silicon carbide having an average particle size of 3 μm, infinite form
Aluminum nitride having an average particle size of 3 μm, infinite form (Volatile Compound)
1. Volatile silane compound
n-Decyltrimethoxysilane has a temperature T1 which brings 90% weight loss when heated at 2° C./minute in the thermogravimetric analysis of 187° C.
n-Octyltriethoxysilane has a temperature T1 which brings 90% weight loss when heated at 2° C./minute in the thermogravimetric analysis of 178° C.
2. Volatile solvent
Toluene with a boiling point of 111° C.

Example 1

100 parts by mass of alkenyl group-containing organopolysiloxane and 10 parts by mass of hydrogen organopolysiloxane as addition-reaction type organopolysiloxanes, 30 parts by mass of dimethyl silicone oil as silicone oil, 170 parts by mass of carbon fibers A, 20 parts by mass of carbon fibers B, 30 parts by mass of carbon fibers C, and 30 parts by mass of flaky graphite as anisotropic fillers, 500 parts by mass of aluminum and 10 parts by mass of aluminum oxide C as non-anisotropic fillers, and 45 parts by mass of n-decyltrimethoxysilane as a volatile compound were mixed, to prepare a heat conductive composition.

Subsequently, release films were disposed on the upper and lower surfaces of a mold set to have a predetermined thickness, and then the heat conductive composition was injected. Then, anisotropic fillers were oriented in the thickness direction by applying a magnetic field of 8 tesla in the thickness direction thereto. Thereafter, the organopolysiloxanes were cured by heating at 80° C. for 120 minutes, to obtain a primary cured product.

Then, the primary cured product was sliced into a sheet having a thickness of 2 mm using a shear blade, to obtain a sheet with the anisotropic fillers exposed. The slicing was performed perpendicularly to the orientation direction of the anisotropic fillers.

Subsequently, the sheet with the anisotropic fillers exposed was heated at 150° C. for 120 minutes, to volatilize the volatile compound contained in the sheet, thereby obtaining a heat conductive sheet. Both surfaces of the heat conductive sheet were polished 10 times back and forth using a polishing paper having a polishing particle with a particle size of 10 μm, to obtain a heat conductive sheet with both surfaces polished and the major axes of the anisotropic fillers oriented in the thickness direction.

Example 2

A heat conductive composition was prepared in the same manner as in Example 1. Then, the heat conductive composition was applied onto the release films using a bar coater, followed by semi-curing, thereby obtaining a preliminarily sheet having a thickness of 500 μm with the anisotropic fillers oriented in the coating direction.

Subsequently, 25 pieces of such preliminarily sheets were layered and compressed wider heating, to obtain a laminated block (primary cured product) having a thickness of 10 mm. When the laminated block was obtained, it was compressed to a thickness reduced by 20%. Then, the laminated block was sliced into a sheet having a thickness of 2 mm using a shear blade, to obtain a sheet with the anisotropic fillers exposed. The slicing was performed perpendicularly to the orientation direction of the anisotropic fillers.

Subsequently, the sheet with the anisotropic fillers exposed was heated at 150° C. for 120 minutes, to volatilize the volatile silane compound contained in the sheet, thereby obtaining a heat conductive sheet. Both surfaces of the heat conductive sheet were polished 10 times back and forth using a polishing paper having a polishing particle with a particle size of 10 μm, to obtain a heat conductive sheet with both surfaces polished and the major axes of the anisotropic fillers oriented in the thickness direction.

Examples 3, 7, 8, 10 to 14, 16, 20, and 21

Each heat conductive sheet with the major axes of the anisotropic fillers oriented in the thickness direction was obtained in the same manner as in Example 1, except that the composition of the heat conductive composition was changed as shown in Table 1 or 2.

Examples 4 to 6, 9, 15, 17 to 19, and 22

Each heat conductive sheet with the major axes of the anisotropic file oriented in the thickness direction was obtained in the same manner as in Example 2, except that the composition of the heat conductive composition was changed as shown in Table 1 or 2.

Comparative Example 1

A heat conductive sheet was obtained in the same manner as in Example 2, except that a heat conductive composition free from volatile compounds as shown in Table 3 was used.

Comparative Example 2

A heat conductive composition free from volatile compounds as shown in Table 3 was prepared. Thereafter, the heat conductive composition was injected into a mold having a sheet-like cavity, and the anisotropic fillers were oriented in the thickness direction by applying a magnetic field of 8 tesla in the thickness direction. Then, the composition was heated under conditions of 80° C. and 60 minutes, followed by further heating under conditions of a temperature of 150° C. and 120 minutes, to obtain a heat conductive sheet of Comparative Example 2.

Comparative Example 3

A heat conductive sheet was obtained in the same manner as in Example 1, except that the composition of the heat conductive composition was changed as shown in Table 3, and the composition was free from anisotropic fillers.

Comparative Example 4

A primary cured product was obtained in the same manner as in Example 1, except that the composition of the heat conductive composition was changed as shown in Table 3. Then, the primary cured product was sliced into a sheet having a thickness of 2 mm using a shear blade, to obtain a sheet. The slicing was performed horizontally to the orientation direction of the anisotropic fillers.

Subsequently, the sheet was heated at 150° C. for 120 minutes, to volatilize the volatile compound contained in the sheet, thereby obtaining a heat conductive sheet. Both surfaces of the heat conductive sheet were polished 10 times back and forth using a polishing paper having a polishing particle with a particle size of 10 μm, to obtain a heat conductive sheet with both surfaces polished and the major axes of the anisotropic fillers oriented perpendicularly to the thickness direction.

Comparative Example 5

A heat conductive composition having the composition shown in Table 3 was prepared. Thereafter, the heat conductive composition was injected into a mold having a sheet-like cavity, followed by heating under conditions of 80° C. and 60 minutes and further heating under conditions of a temperature of 150° C. and 120 minutes, to obtain a heat conductive sheet of Comparative Example 5.

Comparative Example 6

A primary cured product was obtained in the same manner as in Example 1, except that the composition of the heat conductive composition was changed as shown in Table 3. Then, the primary cured product was sliced into a sheet having a thickness of 2 mm using a shear blade, to obtain a sheet. The slicing was performed horizontally to the orientation direction of the anisotropic fillers.

Subsequently, the sheet was heated at 150° C. for 120 minutes, to volatilize the volatile compound contained in the sheet, thereby obtaining a heat conductive sheet. Both surfaces of the heat conductive sheet were polished 10 times back and forth using a polishing paper having a polishing particle with a particle size of 10 μm, to obtain a heat conductive sheet with both surfaces polished and the major axes of the anisotropic fillers oriented perpendicularly to the thickness direction.

TABLE 1

| | | | | Example | | | | | |
|---|---|---|---|---|---|---|---|---|---|
| | | | | 1 | 2 | 3 | 4 | 5 | 6 |
| Heat conductive composition | parts by mass | Matrix resin component | Alkenyl group-containing organopolysiloxane | 100 | 100 | 100 | 100 | 100 | 100 |
| | | | Hydrogen organopolysiloxane | 10 | 10 | 10 | 10 | 10 | 10 |
| | | | Dimethyl silicone oil | 30 | 30 | 63 | 63 | 63 | 30 |
| | | Heat conductive fillers | Carbon fibers A (200 μm) | 170 | 170 | 120 | 120 | 120 | 170 |
| | | | Carbon fibers B (300 μm) | 20 | 20 | 40 | 40 | 40 | 20 |
| | | | Carbon fibers C (100 μm) | 30 | 30 | 40 | 40 | 40 | 30 |
| | | | Flaky graphite (100 μm) | 30 | 30 | | | | 30 |
| | | | Aluminum (3 μm) | 500 | 500 | 500 | 500 | 500 | 500 |
| | | | Aluminum hydroxide A (1 μm) | | | | | | |
| | | | Aluminum hydroxide B (10 μm) | | | | | | |
| | | | Aluminum oxide A (1 μm) | | | | | | |
| | | | Aluminum oxide B (5 μm) | | | | | | |

TABLE 1-continued

|  |  |  |  |  |  |  |  |  |  |
|---|---|---|---|---|---|---|---|---|---|
|  |  |  | Aluminum oxide C (10 μm) | 10 | 10 | 10 | 10 | 10 | 10 |
|  |  |  | Silicon carbide (3 μm) |  |  |  |  |  |  |
|  |  |  | Aluminum nitride (3 μm) |  |  |  |  |  |  |
|  |  | Volatile compound | n-Decyltrimethoxysilane | 45 | 45 | 27 | 27 | 20 | 60 |
|  |  |  | n-Octyltriethoxysilane |  |  |  |  |  |  |
|  |  |  | Toluene |  |  |  |  |  |  |
|  | vol % | Matrix resin component | Organopolysiloxane | 22% | 22% | 23% | 23% | 23% | 22% |
|  |  |  | Dimethyl silicone oil | 6% | 6% | 13% | 13% | 14% | 6% |
|  |  | Heat conductive fillers | Carbon fibers | 20% | 20% | 19% | 19% | 19% | 20% |
|  |  |  | Flaky graphite | 3% | 3% | 0% | 0% | 0% | 3% |
|  |  |  | Aluminum | 36% | 38% | 38% | 38% | 39% | 36% |
|  |  |  | Aluminum hydroxide | 0% | 0% | 0% | 0% | 0% | 0% |
|  |  |  | Aluminum oxide | 0.5% | 0.5% | 0.5% | 0.5% | 0.5% | 0.5% |
|  |  |  | Aluminum nitride | 0% | 0% | 0% | 0% | 0% | 0% |
|  |  | Volatile compound |  | 10% | 10% | 6% | 6% | 5% | 13% |
| Heat conductive sheet | vol % | Matrix resin component | Organopolysiloxane | 25% | 25% | 24% | 24% | 24% | 25% |
|  |  |  | Dimethyl silicone oil | 7% | 7% | 14% | 14% | 14% | 7% |
|  |  | Heat conductive fillers | Carbon fibers | 22% | 22% | 20% | 20% | 20% | 22% |
|  |  |  | Flaky graphite | 3% | 3% | 0% | 0% | 0% | 3% |
|  |  |  | Aluminum | 42% | 42% | 41% | 41% | 41% | 42% |
|  |  |  | Aluminum hydroxide | 0% | 0% | 0% | 0% | 0% | 0% |
|  |  |  | Aluminum oxide | 0.6% | 0.6% | 0.6% | 0.6% | 0.6% | 0.6% |
|  |  |  | Aluminum nitride | 0% | 0% | 0% | 0% | 0% | 0% |
| Volatile compound ratio (*1) % |  |  |  | 26% | 26% | 15% | 15% | 11% | 32% |
| Weight increase rate when immersed in isopropyl alcohol % |  |  |  | 0.3 | 0.3 | 0.2 | 0.2 | 0.1 | 0.4 |
| Heat conductivity W/m · K |  |  |  | 35 | 34 | 25 | 24 | 25 | 35 |
| Orientation direction of anisotropic fillers |  |  |  | Thickness | Thickness | Thickness | Thickness | Thickness | Thickness |
| Compression load (N/□12 mm) | 10% Compression load $F_{10}$ |  |  | 8.1 | 8.7 | 500 | 5.1 | 5.3 | 7.8 |
|  | 20% Compression load $F_{20}$ |  |  | 12.9 | 13.1 | 6.1 | 6.1 | 6.5 | 12.8 |
|  | 30% Compression load $F_{30}$ |  |  | 15.4 | 15.8 | 7 | 7.3 | 7.4 | 15.3 |
| Load property P |  |  |  | 0.31 | 0.31 | 0.18 | 0.24 | 0.17 | 0.32 |
| Distortion of adherends |  |  |  | B | B | A | A | A | B |
| Handleability |  |  |  | A | A | B | B | B | B |

|  |  |  |  | Example |  |  |  |  |
|---|---|---|---|---|---|---|---|---|
|  |  |  |  | 7 | 8 | 9 | 10 | 11 |
| Heat conductive composition | parts by mass | Matrix resin component | Alkenyl group-containing organopolysiloxane | 100 | 100 | 100 | 75 | 90 |
|  |  |  | Hydrogen organopolysiloxane | 10 | 10 | 10 | 7.5 | 10 |
|  |  |  | Dimethyl silicone oil | 62 | 62 | 62 | 82 | 55 |
|  |  | Heat conductive fillers | Carbon fibers A (200 μm) | 140 | 140 | 140 |  |  |
|  |  |  | Carbon fibers B (300 μm) | 40 | 40 | 40 | 140 | 220 |
|  |  |  | Carbon fibers C (100 μm) | 40 | 40 | 40 | 40 |  |
|  |  |  | Flaky graphite (100 μm) |  |  |  |  |  |
|  |  |  | Aluminum (3 μm) | 500 | 500 | 500 |  |  |
|  |  |  | Aluminum hydroxide A (1 μm) |  |  |  | 50 |  |
|  |  |  | Aluminum hydroxide B (10 μm) |  |  |  | 440 |  |
|  |  |  | Aluminum oxide A (1 μm) |  |  |  |  | 10 |
|  |  |  | Aluminum oxide B (5 μm) |  |  |  |  | 500 |
|  |  |  | Aluminum oxide C (10 μm) | 10 | 10 | 10 | 100 |  |
|  |  |  | Silicon carbide (3 μm) |  |  |  |  |  |
|  |  |  | Aluminum nitride (3 μm) |  |  |  |  |  |
|  |  | Volatile compound | n-Decyltrimethoxysilane | 27 |  | 27 | 32.5 | 15 |
|  |  |  | n-Octyltriethoxysilane |  | 27 |  |  |  |
|  |  |  | Toluene |  |  |  |  |  |
|  | vol % | Matrix resin component | Organopolysiloxane | 22% | 22% | 22% | 16% | 25% |
|  |  |  | Dimethyl silicone oil | 13% | 13% | 13% | 16% | 14% |
|  |  | Heat conductive fillers | Carbon fibers | 20% | 20% | 20% | 16% | 25% |
|  |  |  | Flaky graphite | 0% | 0% | 0% | 0% | 0% |
|  |  |  | Aluminum | 38% | 38% | 38% | 0% | 0% |
|  |  |  | Aluminum hydroxide | 0% | 0% | 0% | 40% | 0% |
|  |  |  | Aluminum oxide | 0.5% | 0.5% | 0.5% | 4.9% | 32% |
|  |  |  | Aluminum nitride | 0% | 0% | 0% | 0% | 0% |
|  |  | Volatile compound |  | 6% | 6% | 6% | 7% | 4% |
| Heat conductive sheet | vol % | Matrix resin component | Organopolysiloxane | 24% | 24% | 24% | 17% | 26% |
|  |  |  | Dimethyl silicone oil | 14% | 14% | 14% | 18% | 15% |
|  |  | Heat conductive fillers | Carbon fibers | 21% | 21% | 22% | 17% | 26% |
|  |  |  | Flaky graphite | 0% | 0% | 0% | 0% | 0% |
|  |  |  | Aluminum | 40% | 40% | 40% | 0% | 0% |
|  |  |  | Aluminum hydroxide | 0% | 0% | 0% | 43% | 0% |
|  |  |  | Aluminum oxide | 0.5% | 0.5% | 0.5% | 5.3% | 33.4% |
|  |  |  | Aluminum nitride | 0% | 0% | 0% | 0% | 0% |
| Volatile compound ratio (*1) % |  |  |  | 15% | 15% | 15% | 18% | 10% |
| Weight increase rate when immersed in isopropyl alcohol % |  |  |  | 0.2 | 0.2 | 0.2 | 0.2 | 0.1 |
| Heat conductivity W/m · K |  |  |  | 28 | 28 | 28 | 19 | 20 |
| Orientation direction of anisotropic fillers |  |  |  | Thickness | Thickness | Thickness | Thickness | Thickness |

TABLE 1-continued

| | | | | | | |
|---|---|---|---|---|---|---|
| Compression load (N/□12 mm) | 10% Compression load $F_{10}$ | 6.3 | 6.5 | 9 | 4.8 | 3.8 |
| | 20% Compression load $F_{20}$ | 7.7 | 7.9 | 11.4 | 8.5 | 8.1 |
| | 30% Compression load $F_{30}$ | 9.7 | 9.8 | 13.8 | 10.3 | 10.5 |
| Load property P | | 0.32 | 0.29 | 0.27 | 0.38 | 0.63 |
| Distortion of adherends | | A | A | B | B | B |
| Handleability | | B | B | A | C | C |

(*1) Volatile compound ratio (%) was calculated by 100 × [volatile compound/(organopolysiloxane + silicone oil + volatile compound)]

TABLE 2

| | | | | | Example | | | | | |
|---|---|---|---|---|---|---|---|---|---|---|
| | | | | | 12 | 13 | 14 | 15 | 16 | 17 |
| Heat conductive composition | parts by mass | Matrix resin component | Alkenyl group-containing organopolysiloxane | | 90 | 90 | 100 | 100 | 100 | 100 |
| | | | Hydrogen organopolysiloxane | | 10 | 10 | 10 | 10 | 10 | 10 |
| | | | Dimethyl silicone oil | | 15 | | 30 | 30 | | 40 |
| | | Heat conductive fillers | Carbon fibers A (200 μm) | | | | 80 | 80 | 80 | 80 |
| | | | Carbon fibers B (300 μm) | | 220 | 230 | 60 | 60 | 40 | 40 |
| | | | Carbon fibers C (100 μm) | | | | 40 | 40 | 40 | 40 |
| | | | Flaky graphite (100 μm) | | | | 15 | 15 | | |
| | | | Aluminum (3 μm) | | | | | | | |
| | | | Aluminum hydroxide A (1 μm) | | | | 70 | 70 | 70 | 70 |
| | | | Aluminum hydroxide B (10 μm) | | | 600 | 300 | 300 | 300 | 300 |
| | | | Aluminum oxide A (1 μm) | | 10 | | | | | |
| | | | Aluminum oxide B (5 μm) | | 500 | | | | | |
| | | | Aluminum oxide C (10 μm) | | | 120 | | | | |
| | | | Silicon carbide (3 μm) | | | | 25 | 25 | 25 | 25 |
| | | | Aluminum nitride (3 μm) | | | | | | | |
| | | Volatile compound | n-Decyltrimethoxysilane | | 55 | | 45 | 45 | 27 | 27 |
| | | | n-Octyltriethoxysilane | | | | | | | |
| | | | Toluene | | | 60 | | | | |
| | vol % | Matrix resin component | Organopolysiloxane | | 25% | 18% | 25% | 25% | 27% | 27% |
| | | | Dimethyl silicone oil | | 4% | 0% | 7% | 7% | 10% | 10% |
| | | Heat conductive fillers | Carbon fibers | | 25% | 19% | 19% | 19% | 18% | 18% |
| | | | Flaky graphite | | 0% | 0% | 2% | 2% | 0% | 0% |
| | | | Aluminum | | 0% | 0% | 0% | 0% | 0% | 0% |
| | | | Aluminum hydroxide | | 0% | 45% | 36% | 36% | 38% | 38% |
| | | | Aluminum oxide | | 31.7% | 5.5% | 0% | 0% | 0% | 0% |
| | | | Aluminum nitride | | 0% | 0% | 0% | 0% | 0% | 0% |
| | | Volatile compound | | | 15% | 12% | 12% | 12% | 7% | 7% |
| Heat conductive sheet | vol % | Matrix resin component | Organopolysiloxane | | 29% | 21% | 29% | 29% | 29% | 29% |
| | | | Dimethyl silicone oil | | 5% | 0% | 8% | 8% | 11% | 11% |
| | | Heat conductive fillers | Carbon fibers | | 29% | 21% | 21% | 21% | 19% | 19% |
| | | | Flaky graphite | | 0% | 0% | 2% | 2% | 0% | 0% |
| | | | Aluminum | | 0% | 0% | 0% | 0% | 0% | 0% |
| | | | Aluminum hydroxide | | 0% | 52% | 40% | 40% | 41% | 41% |
| | | | Aluminum oxide | | 37.4% | 6.2% | 0% | 0% | 0% | 0% |
| | | | Aluminum nitride | | 0% | 0% | 0% | 0% | 0% | 0% |
| Volatile compound ratio (*1) % | | | | | 35% | 40% | 26% | 28% | 17% | 17% |
| Weight increase rate when immersed in isopropyl alcohol % | | | | | 0.5 | 0.22 | 0.3 | 0.3 | 0.2 | 0.2 |
| Heat conductivity W/m · K | | | | | 27 | 15 | 27 | 25 | 22 | 21 |
| Orientation direction of anisotropic fillers | | | | | Thickness | Thickness | Thickness | Thickness | Thickness | Thickness |
| Compression load (N/□12 mm) | 10% Compression load $F_{10}$ | | | | 3.9 | 4.8 | 9.5 | 9.9 | 6.9 | 7.3 |
| | 20% Compression load $F_{20}$ | | | | 8.5 | 9.9 | 14.6 | 14.2 | 11.5 | 11.9 |
| | 30% Compression load $F_{30}$ | | | | 11.2 | 12.8 | 17.8 | 17.5 | 12.8 | 13.1 |
| Load property P | | | | | 0.69 | 0.60 | 0.34 | 0.33 | 0.19 | 0.16 |
| Distortion of adherends | | | | | B | B | C | C | B | B |
| Handleability | | | | | C | C | A | A | B | B |

| | | | | | Example | | | | |
|---|---|---|---|---|---|---|---|---|---|
| | | | | | 18 | 19 | 20 | 21 | 22 |
| Heat conductive composition | parts by mass | Matrix resin component | Alkenyl group-containing organopolysiloxane | | 100 | 100 | 100 | 100 | 100 |
| | | | Hydrogen organopolysiloxane | | 10 | 10 | 10 | 10 | 10 |
| | | | Dimethyl silicone oil | | 63 | 30 | 62 | 62 | 62 |
| | | Heat conductive fillers | Carbon fibers A (200 μm) | | 80 | 110 | 80 | 80 | 80 |
| | | | Carbon fibers B (300 μm) | | 60 | 60 | 60 | 60 | 60 |
| | | | Carbon fibers C (100 μm) | | 40 | 40 | 40 | 40 | 40 |
| | | | Flaky graphite (100 μm) | | 15 | 15 | 15 | 15 | 15 |
| | | | Aluminum (3 μm) | | | | | | |
| | | | Aluminum hydroxide A (1 μm) | | 70 | 70 | 70 | 70 | 70 |
| | | | Aluminum hydroxide B (10 μm) | | 300 | 300 | 300 | 300 | 300 |
| | | | Aluminum oxide A (1 μm) | | | | | | |

TABLE 2-continued

| | | | | | | | | | |
|---|---|---|---|---|---|---|---|---|---|
| | | | | Aluminum oxide B (5 μm) | | | | | |
| | | | | Aluminum oxide C (10 μm) | | | | | |
| | | | | Silicon carbide (3 μm) | 25 | 25 | 25 | 25 | 25 |
| | | | | Aluminum nitride (3 μm) | | | | | |
| | | | Volatile compound | n-Decyltrimethoxysilane | 20 | 60 | 45 | | 27 |
| | | | | n-Octyltriethoxysilane | | | | 45 | |
| | | | | Toluene | | | | | |
| | | vol % | Matrix resin component | Organopolysiloxane | 25% | 25% | 24% | 24% | 25% |
| | | | | Dimethyl silicone oil | 15% | 15% | 14% | 14% | 14% |
| | | | Heat conductive fillers | Carbon fibers | 18% | 18% | 17% | 17% | 18% |
| | | | | Flaky graphite | 2% | 2 % | 1% | 1% | 2% |
| | | | | Aluminum | 0% | 0% | 0% | 0% | 0% |
| | | | | Aluminum hydroxide | 35% | 35% | 33% | 33% | 35% |
| | | | | Aluminum oxide | 0% | 0% | 0% | 0% | 0% |
| | | | | Aluminum nitride | 0% | 0% | 0% | 0% | 0% |
| | | | | Volatile compound | 5% | 5% | 11% | 11% | 7% |
| Heat conductive sheet | vol % | Matrix resin component | | Organopolysiloxane | 26% | 26% | 26% | 26% | 26% |
| | | | | Dimethyl silicone oil | 15% | 15% | 15% | 15% | 15% |
| | | Heat conductive fillers | | Carbon fibers | 19% | 19% | 19% | 19% | 19% |
| | | | | Flaky graphite | 2% | 2% | 2% | 2% | 2% |
| | | | | Aluminum | 0% | 0% | 0% | 0% | 0% |
| | | | | Aluminum hydroxide | 37% | 37% | 37% | 37% | 37% |
| | | | | Aluminum oxide | 0% | 0% | 0% | 0% | 0% |
| | | | | Aluminum nitride | 0% | 0% | 0% | 0% | 0% |
| | | | | Volatile compound ratio (*1) % | 11% | 11% | 22% | 22% | 15% |
| | | | | Weight increase rate when immersed in isopropyl alcohol % | 0.1 | 0.4 | 0.2 | 0.2 | 0.2 |
| | | | | Heat conductivity W/m · K | 21 | 32 | 23 | 23 | 23 |
| | | | | Orientation direction of anisotropic fillers | Thickness | Thickness | Thickness | Thickness | Thickness |
| | | Compression load (N/□12 mm) | | 10% Compression load $F_{10}$ | 8.5 | 8.9 | 9.2 | 8.5 | 9.8 |
| | | | | 20% Compression load $F_{20}$ | 13.4 | 12.8 | 13.5 | 14.8 | 15.1 |
| | | | | 30% Compression load $F_{30}$ | 15.1 | 15.3 | 16.5 | 17.1 | 17.7 |
| | | | | Load property P | 0.20 | 0.28 | 0.33 | 0.27 | 0.27 |
| | | | | Distortion of adherends | B | B | C | C | C |
| | | | | Handleability | A | B | A | A | A |

(*1) Volatile compound ratio (%) was calculated by 100 × [volatile compound/(organopolysiloxane + silicone oil + volatile compound)]

TABLE 3

| | | | | | Comparative Example | | | | | |
|---|---|---|---|---|---|---|---|---|---|---|
| | | | | | 1 | 2 | 3 | 4 | 5 | 6 |
| Heat conductive composition | parts by mass | Matrix resin component | Alkenyl group-containing organopolysiloxane | | 60 | 90.9 | 95 | 100 | 100 | 127 |
| | | | Hydrogen organopolysiloxane | | 40 | 9.1 | 5 | 10 | 10 | 13 |
| | | | Dimethyl silicone oil | | | | | | | |
| | | Heat conductive fillers | Carbon fibers A (200 μm) | | | | | 140 | 140 | 80 |
| | | | Carbon fibers B (300 μm) | | 149 | | | 40 | 40 | 60 |
| | | | Carbon fibers C (100 μm) | | | | 110 | 40 | 40 | 45 |
| | | | Flaky graphite (100 μm) | | | | | | | 10 |
| | | | Aluminum (3 μm) | | | | | 500 | 500 | |
| | | | Aluminum hydroxide A (1 μm) | | | | 140 | | | 70 |
| | | | Aluminum hydroxide B (10 μm) | | | | 140 | | | 300 |
| | | | Aluminum oxide A (1 μm) | | | 450 | | | | |
| | | | Aluminum oxide B (5 μm) | | 244 | | | | | |
| | | | Aluminum oxide C (10 μm) | | | | | 10 | 10 | |
| | | | Silicon carbide (3 μm) | | | | | | | 25 |
| | | | Aluminum nitride (3 μm) | | 235 | | | | | |
| | | Volatile compound | n-Decyltrimethoxysilane | | | 0 | | 27 | 27 | 40 |
| | | | n-Octyltriethoxysilane | | | | | | | |
| | | | Toluene | | | | | | | |
| | vol % | Matrix resin component | Organopolysiloxane | | 33% | 38% | 46% | 26% | 26% | 33% |
| | | | Dimethyl silicone oil | | 0% | 0% | 0% | 0% | 0% | 0% |
| | | Heat conductive fillers | Carbon fibers | | 22% | 19% | 0% | 23% | 23% | 20% |
| | | | Flaky graphite | | 0% | 0% | 0% | 0% | 0% | 1% |
| | | | Aluminum | | 0% | 0% | 0% | 43% | 43% | 0% |
| | | | Aluminum hydroxide | | 0% | 0% | 54% | 0% | 0% | 36% |
| | | | Aluminum oxide | | 20.4% | 43.1% | 0% | 1% | 1% | 0% |
| | | | Aluminum nitride | | 24% | 0% | 0% | 0% | 0% | 0% |
| | | Volatile compound | | | 0% | 0% | 0% | 7% | 7% | 10% |
| Heat conductive sheet | vol % | Matrix resin component | Organopolysiloxane | | 33% | 38% | 46% | 28% | 28% | 37% |
| | | | Dimethyl silicone oil | | 0% | 0% | 0% | 0% | 0% | 0% |
| | | Heat conductive fillers | Carbon fibers | | 22% | 19% | 0% | 25% | 25% | 22% |
| | | | Flaky graphite | | 0% | 0% | 0% | 0% | 0% | 1% |
| | | | Aluminum | | 0% | 0% | 0% | 47% | 47% | 0% |
| | | | Aluminum hydroxide | | 0% | 0% | 54% | 0% | 0% | 40% |

TABLE 3-continued

| | | Comparative Example | | | | | |
|---|---|---|---|---|---|---|---|
| | | 1 | 2 | 3 | 4 | 5 | 6 |
| | Aluminum oxide | 20% | 43% | 0% | 0.6% | 0.6% | 0% |
| | Aluminum nitride | 24% | 0% | 0% | 0% | 0% | 0% |
| Volatile compound ratio (*1) % | | 0% | 0% | 0% | 21% | 21% | 24% |
| Weight increase rate when immersed in isopropyl alcohol % | | 0 | 0 | 0 | 0.2 | 0.2 | 0.3 |
| Heat conductivity W/m · K | | 20 | 12 | 1.5 | 3.5 | 3.3 | 3.5 |
| Orientation direction of anisotropic fillers | | Thickness | Thickness | — | Horizontal | — | Horizontal |
| Compression load (N/□12 mm) | 10% Compression load $F_{10}$ | 7.9 | 3.1 | 1.4 | 5.4 | 6.4 | 7.8 |
| | 20% Compression load $F_{20}$ | 15.7 | 6.0 | 7.2 | 18.8 | 21.1 | 20.6 |
| | 30% Compression load $F_{30}$ | 22.1 | 9.2 | 14.4 | 34.3 | 41.2 | 44.1 |
| Load property P | | 0.81 | 1.0 | 5.0 | 2.9 | 3.2 | 3.0 |
| Distortion of adherends | | D | A | B | D | D | D |
| Handleability | | B | D | D | B | B | B |

(*1) Volatile compound ratio (%) was calculated by 100 × [volatile compound/(organopolysiloxane + silicone oil + volatile compound)]

The heat conductive sheets of Examples each contain anisotropic tillers with their major axes oriented in the thickness direction of the sheet and satisfy a load property P of 0.1 to 0.7. Therefore, the handleability was good, the distortion of adherends was less, and the softness was also good. In particular, it is understood that heat conductive sheets having a load property P of 0.1 to 0.35 are evaluated as having a handleability of "B" or higher, and thus the balance between the two physical properties is excellent.

Further, heat conductive sheets using a large amount of aluminum oxide (for example, 5 vol % or more or 10 vol % or more) as a heat conductive filler satisfy the value of the load property P of 0.1 to 0.7 but are out of the suitable range, and the handleability is relatively poor.

As compared to this, in the case of using aluminum or aluminum hydroxide as heat conductive fillers, both the handleability and the distortion of adherends (softness) were evaluated as "B" or higher in many cases. In particular, it turned out that the range of the load property P in which the two physical properties were evaluated as "B" or higher was wide, in the case of using aluminum (Examples 1 to 9).

In contrast, the heat conductive sheets of Comparative Examples 1 to 6 had compression properties outside the range specified in the present invention. As a result, the evaluation of any of handleability and distortion of adherends (softness) was poor.

The heat conductive sheets of Comparative Examples 1, to 3 were produced without using volatile compounds, and the heat conductive sheets of Comparative Examples 3 to 6 do not contain anisotropic fillers, or even if containing anisotropic fillers, the anisotropic fillers are not oriented in the thickness direction of each heat conductive sheet. Therefore, it is considered that the heat conductive sheets do not have a structure that satisfies a desired load property P.

REFERENCE SIGNS LIST

12: First copper block
13: Second copper block
16: Cylinder
P1: Mounting surface
P2: Pressing surface
S1: Test specimen
21: Heat insulator
22: First copper block
23: Second copper block
24: Heater
25: Heat sink
26: Cylinder
Q1: Mounting surface
Q2: Lower surface of second copper block
S2: Test specimen
$θ_{j0}$: Temperature of second copper block
$θ_{j1}$: Temperature of first copper block

The invention claimed is:

1. A heat conductive sheet comprising: a matrix comprising in an entirety of the matrix a cured product of organopolysiloxane; and heat conductive fillers comprising anisotropic fillers and non-anisotropic fillers,
wherein a major axes of the anisotropic fillers is oriented in a thickness direction,
wherein the anisotropic fillers have an aspect ratio over 2,
wherein a volume filling rate of the anisotropic fillers based on a total amount of the heat conductive sheet is 2 to 40 vol %,
wherein the non-anisotropic fillers comprise aluminum and aluminum oxide, wherein the non-anisotropic fillers comprise 10 to 70 vol % of the aluminum and 10 vol % or less of the aluminum oxide, the total amount of the non-anisotropic fillers being 10 to 70 vol % of the heat conductive sheet,
wherein the non-anisotropic fillers have an aspect ratio of 2 or less,
wherein an average particle size of the non-anisotropic fillers is 0.1 to 70 μm,
wherein the heat conductive fillers are dispersed in and throughout the matrix, and
wherein the heat conductive sheet has a load property P represented by formula (1) below of 0.1 to 0.7:

$$\text{Load property } P=(F_{30}-F_{20})/F_{10} \quad (1)$$

wherein $F_{10}$ is a load of the heat conductive sheet at 10% compression, $F_{20}$ is a load of the heat conductive sheet at 20% compression, and $F_{30}$ is a load of the heat conductive sheet at 30% compression.

2. The heat conductive sheet according to claim 1, wherein the load $F_{30}$ at 30% compression is 5 to 18 N/144 mm$^2$.

3. The heat conductive sheet according to claim 1, wherein the load $F_{10}$ at 10% compression is 3.5 to 10 N/144 mm$^2$.

4. The heat conductive sheet according to claim 1, wherein the heat conductive sheet is formed from a heat conductive composition comprising a silicone compound comprising the organopolysiloxane; the heat conductive fillers comprising the anisotropic fillers and the non-anisotropic fillers; and a volatile compound.

5. The heat conductive sheet according to claim 4, wherein the volatile compound is a volatile silane compound.

6. The heat conductive sheet according to claim 5, wherein a volume of the volatile silane compound with respect to a total volume of the silicone compound and the volatile silane compound in the heat conductive composition is 15 to 50 vol %.

7. The heat conductive sheet according to claim 1, wherein an aspect ratio of the anisotropic fillers is 5 or more.

8. The heat conductive sheet according to claim 1, wherein the non-anisotropic fillers further comprise aluminum hydroxide.

9. The heat conductive sheet according to claim 1, wherein the heat conductive sheet has voids.

10. The heat conductive sheet according to claim 1, wherein the non-anisotropic fillers comprise 40 to 42 vol % of the aluminum and 10 vol % or less of the aluminum oxide.

11. A method for producing the heat conductive sheet according to claim 1, the method comprising:
preparation step 1 of preparing a heat conductive composition comprising a silicone compound comprising the organopolysiloxane, the heat conductive fillers comprising the anisotropic fillers, and a volatile compound;
curing step 2 of heating the heat conductive composition to cure the organopolysiloxane, thereby forming a primary cured product retaining the volatile compound;
sheet-forming step 3 of slicing the primary cured product to obtain a sheet having a surface with the heat conductive fillers exposed, and
volatilization step 4 of volatilizing the volatile compound contained in the sheet obtained by the sheet-forming step 3.

12. The method for producing the heat conductive sheet according to claim 11, wherein the volatile compound is a volatile silane compound, and when a temperature at 90% weight loss when heated at 2° C./minute in a thermogravimetric analysis of the volatile silane compound is referred to as T1, the heating temperature in the curing step 2 is T1−50° C. or lower.

13. A heat conductive sheet comprising: a matrix comprising in an entirety of the matrix a cured product of organopolysiloxane; and heat conductive fillers comprising anisotropic fillers and non-anisotropic fillers,
wherein a major axes of the anisotropic fillers is oriented in a thickness direction,
wherein a number of the anisotropic fillers with their major axis direction being less than 20° with respect to the thickness direction accounts for over 60% of a total number of the anisotropic fillers,
wherein an aspect ratio of the anisotropic fillers, which are fiber materials or flat materials, is over 2 and less than 100,
wherein when the anisotropic fillers are fiber materials, an average fiber length of the fiber materials is 5 to 600 µm,
wherein when the anisotropic fillers are flat materials, an average major axis length of the flat materials is 5 to 300 µm,
wherein a volume filling rate of the anisotropic fillers based on a total amount of the heat conductive sheet is 2 to 40 vol %,
wherein the non-anisotropic fillers comprise aluminum and aluminum oxide, wherein the non-anisotropic fillers comprise 10 to 70 vol % of the aluminum and 10 vol % or less of the aluminum oxide, the total amount of the non-anisotropic fillers being 10 to 70 vol % of the heat conductive sheet,
wherein the non-anisotropic fillers have an aspect ratio of 2 or less,
wherein an average particle size of the non-anisotropic fillers is 0.1 to 70 µm,
wherein the heat conductive fillers are dispersed in and throughout the matrix, and
wherein the heat conductive sheet has a load property P represented by formula (1) below of 0.1 to 0.7:

$$\text{Load property } P=(F_{30}-F_{20})/F_{10} \tag{1}$$

wherein $F_{10}$ is a load of the heat conductive sheet at 10% compression, $F_{20}$ is a load of the heat conductive sheet at 20% compression, and $F_{30}$ is a load of the heat conductive sheet at 30% compression.

14. The heat conductive sheet according to claim 13, wherein the non-anisotropic fillers further comprise aluminum hydroxide.

15. The heat conductive sheet according to claim 13, wherein the heat conductive sheet has voids.

16. The heat conductive sheet according to claim 13, wherein the non-anisotropic fillers comprise 40 to 42 vol % of the aluminum and 10 vol % or less of the aluminum oxide.

* * * * *